US010930706B2

(12) United States Patent
Ge et al.

(10) Patent No.: US 10,930,706 B2
(45) Date of Patent: Feb. 23, 2021

(54) REDUCING RRAM RELAXATION IN CROSSBAR ARRAYS FOR LOW CURRENT APPLICATIONS

(71) Applicant: TETRAMEM INC., Newark, CA (US)

(72) Inventors: Ning Ge, Newark, CA (US); Minxian Zhang, Newark, CA (US)

( * ) Notice: Subject to any disclaimer, the term of this patent is extended or adjusted under 35 U.S.C. 154(b) by 0 days.

(21) Appl. No.: 16/392,227

(22) Filed: Apr. 23, 2019

(65) Prior Publication Data

US 2020/0343303 A1 Oct. 29, 2020

(51) Int. Cl.
*H01L 27/24* (2006.01)
*H01L 45/00* (2006.01)

(52) U.S. Cl.
CPC ...... *H01L 27/2463* (2013.01); *H01L 27/2436* (2013.01); *H01L 45/1253* (2013.01); *H01L 45/146* (2013.01)

(58) Field of Classification Search
CPC . H01L 27/24; H01L 27/2436; H01L 27/2463; H01L 45/12; H01L 45/125; H01L 45/1253; H01L 45/14; H01L 45/146
See application file for complete search history.

(56) References Cited

U.S. PATENT DOCUMENTS

2013/0089949 A1* 4/2013 Phatak ................ H01L 45/1616 438/104
2014/0179100 A1* 6/2014 Niyogi ................ H01L 21/3215 438/659
2015/0021537 A1* 1/2015 Xie ..................... H01L 45/1616 257/2
2018/0375021 A1* 12/2018 Wang ..................... H01L 45/04

* cited by examiner

*Primary Examiner* — Fazli Erdem
(74) *Attorney, Agent, or Firm* — Zheng Andy Liu

(57) ABSTRACT

Systems and methods for reducing RRAM relaxation in crossbar array circuits for low current applications are provided. In some implementations, an apparatus comprises: a first row wire; a first column wire; an RRAM device; an access control device, wherein the RRAM device and the access control device serially connected and connecting between the first row wire and the first column wire, and wherein the RRAM device comprises: a first electrode; a first switching layer formed on the first electrode; and a second electrode formed on the first switching layer, wherein the first switching layer is doped with a first oxide material comprising $SiO_2$, or $Al_2O_3$. The first electrode and the second electrode are, in some implementations, made of one of the following materials: Pt, Pd, Ta, Ti, Hf, W, TiN, and TaN.

13 Claims, 10 Drawing Sheets

300

| Oxide | Dielectric Constant (Dk) |
|---|---|
| $Ta_2O_5$ | 22 |
| $HfO_2$ | 25 |
| $ZrO_2$ | 25 |
| $TiO_2$ | 80 |

| Oxide | Dielectric Constant (Dk) |
|---|---|
| $SiO_2$ | 3.9 |
| $Al_2O_3$ | 9 |

| Oxide | Dielectric Constant (Dk) |
|---|---|
| $HfSiO_4$ | 11 |
| $ZrSiO_4$ | 9 |

REDUCING RRAM RELAXATION IN CROSSBAR ARRAYS FOR LOW CURRENT APPLICATIONS

TECHNICAL FIELD

The present disclosure generally related to crossbar array circuits with Resistive Random-Access Memory (RRAM) and more specifically to reducing RRAM relaxation in crossbar array circuits and preventing data loss in low current applications.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a FIRS to a LRS is often referred to as a "Set" or "On" switch; the switching systems from a LRS to a FIRS is often referred to as a "Reset" or "Off" switching process.

RRAMs are known to have the relaxation issue, especially when RRAM is reset to a high resistance value—after a reset, an RRAM's FIRS resistance decreases once external voltage is removed, resulting in an early data loss. This limits the applications of RRAM crossbar arrays, especially in low current applications.

SUMMARY

Technologies relating to reducing RRAM relaxation in crossbar arrays for low current applications are disclosed.

In some implementations, an apparatus comprises: a first row wire; a first column wire; an RRAM device; an access control device, wherein the RRAM device and the access control device serially connected and connecting between the first row wire and the first column wire, and wherein the RRAM device comprises: a first electrode; a first switching layer formed on the first electrode; and a second electrode formed on the first switching layer, wherein the first switching layer is doped with a first oxide material comprising $SiO_2$, or $Al_2O_3$.

In some implementations, the first switching layer is made of one of the following materials: $ZrO_2$, $HfO_2$, $TiO_2$, or $Ta_2O_5$.

In some implementations, the RRAM device further comprises: a thin layer formed between the first electrode and the first switching layer, and the thin layer is made of one of the following materials: $ZrSi_xO_y$, $HfSi_xO_y$, $TaSi_xO_y$, and $TiSi_xO_y$.

In some implementations, the apparatus further comprises: a second switching layer formed between the first switching layer and the second electrode, wherein the second switching layer is made of one of the following materials: CeOx, TaOx, or TiOx.

In some implementations, the second switching layer is doped with a second oxide material comprising $SiO_2$, or $Al_2O_3$.

In some implementations, the RRAM device further comprises: a thin layer formed between the first switching layer and the second switching layer, and the thin layer is made of one of the following materials: $ZrSi_xO_y$, $HfSi_xO_y$, $TaSi_xO_y$, and $TiSi_xO_y$.

In some implementations, the RRAM device further comprises: a thin layer formed between the first switching layer and the first electrode, and the thin layer is made of one of the following materials: $ZrSi_xO_y$, $HfSi_xO_y$, $TaSi_xO_y$, and $TiSi_xO_y$.

In some implementations, the apparatus further comprises: an interlayer formed between the first switching layer and the second electrode; wherein a material of the interlayer comprises $SiO_2$, $Al_2O_3$ or Si.

In some implementations, the RRAM device further comprises: a thin layer formed between the first switching layer and the interlayer, and the thin layer is made of one of the following materials: $ZrSi_xO_y$, $HfSi_xO_y$, $TaSi_xO_y$, and $TiSi_xO_y$.

In some implementations, the access control device comprises a transistor or a selector.

In some implementations, the first electrode is made of one of the following materials: Pt, Pd, Ta, Ti, Hf, W, TiN, and TaN.

In some implementations, the second electrode is made of one of the following materials: Pt, Pd, Ta, Ti, Hf, W, TiN, and TaN.

In some implementations, an apparatus comprises: a first row wire; a first column wire; an RRAM device; an access control device, wherein the RRAM device and the access control device serially connected and connecting between the first row wire and the first column wire, and wherein the RRAM device comprises: a first electrode; a first switching layer formed on the first electrode; a second electrode formed on the first switching layer; and a thin layer formed between the first electrode and the first switching layer, wherein the first switching layer is made of one of the following materials: $ZrO_2$, $HfO_2$, $TiO_2$, or $Ta_2O_5$; and the thin layer is made of one of the following materials: $ZrSi_xO_y$, $HfSi_xO_y$, $TaSi_xO_y$, and $TiSi_xO_y$.

In some implementations, an apparatus comprises: a first row wire; a first column wire; an RRAM device; an access control device, wherein the RRAM device and the access control device serially connected and connecting between the first row wire and the first column wire, and wherein the RRAM device comprises: a first electrode; a first switching layer formed on the first electrode; a second switching layer formed on the first switching layer; a second electrode formed on the second switching layer; and a thin layer formed between the first switching layer and the second switching layer, wherein the first switching layer is made of one of the following materials: $ZrO_2$, $HfO_2$, $TiO_2$, or $Ta_2O_5$; the thin layer is made of one of the following materials: $CeO_x$, $TaO_x$, and $TiO_x$; and the thin layer is made of one of the following materials: $ZrSi_xO_y$, $HfSi_xO_y$, $TaSi_xO_y$, and $TiSi_xO_y$.

BRIEF DESCRIPTION OF THE DRAWINGS

FIGS. 3A-3C are dielectric constant tables as references in some implementations of the present disclosure.

The implementations disclosed herein are illustrated by way of example, and not by way of limitation, in the figures of the accompanying drawings. Like reference numerals refer to corresponding parts throughout the drawings.

DETAILED DESCRIPTION

Systems and methods for reducing RRAM relaxation in crossbar array circuits for low current applications are provided. The technologies described in the present disclosure may provide the following technical advantages.

First, common RRAM devices have shown initial data loss due to relaxation, especially in HRS. It is because the common transition metal oxides used in the RRAM (e.g., TaOx, HfOx, etc.) have relatively high dielectric constant. Therefore, by using the material and process provided in the present disclosure, the overall dielectric constant of the RRAM device is significantly reduced, and the relaxation issue may be minimized.

Second, by using the material and process provided, the RRAM device in the present disclosure has excellent thermodynamic stability and low leakage current during low current operations. This increase the RRAM device's capability in low current applications.

Third, the technology provided may further increase RRAM device's oxide/electrode interface stability which reduces leakage current paths and thus contributes to a lower leakage current.

Figure 1:
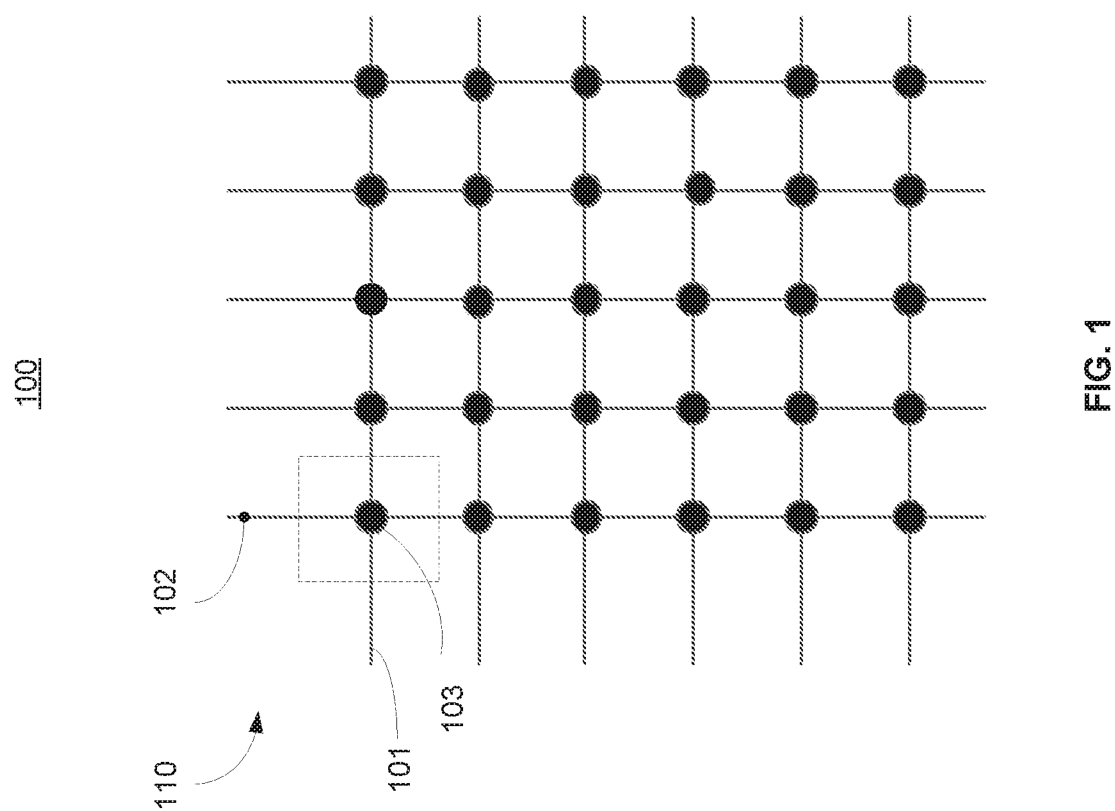
FIG. 1 is a block diagram illustrating an example crossbar array using a low dielectric constant RRAM device in accordance with some implementations of the present disclosure.

FIG. 1 is a block diagram illustrating an example crossbar array circuit 100 in accordance with some implementations of the present disclosure. As shown in FIG. 1, the crossbar array circuit 100 includes a crossbar array 110, which includes a plurality of column wires (e.g., the column wire 102), a plurality of row wires (e.g., the row wire 101), and a plurality of crossbar devices (e.g., the crossbar device 103) connected between the plurality of column wires and the plurality of row wires.

Figure 2:
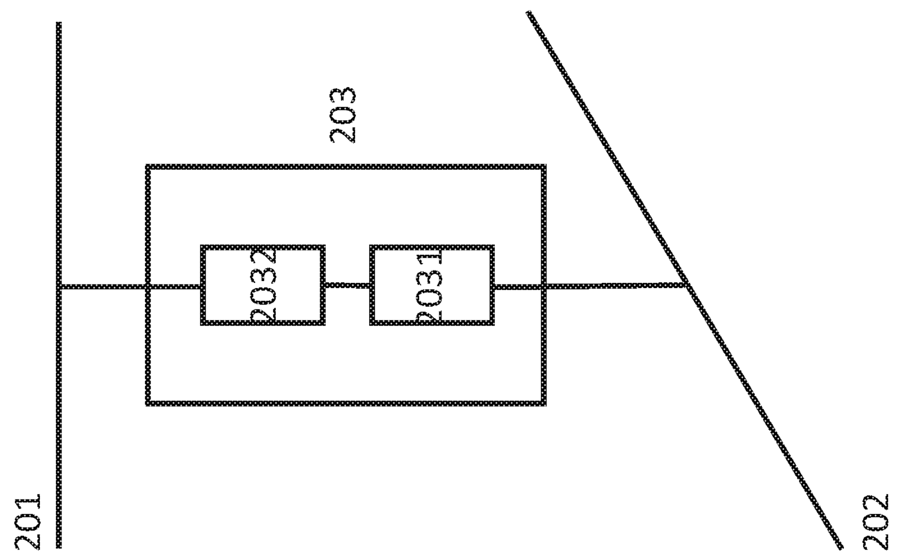
FIG. 2 is a block diagram illustrating an example cross-point device pair using a low dielectric constant RRAM device in accordance with some implementations of the present disclosure.

FIG. 2 shows a block diagram 200 illustrating an example cross-point device pair 203 using a low dielectric constant RRAM device in accordance with some implementations. The cross-point device pair 203 shown in FIG. 2 is an enlarged view of the cross-point device pair 103 shown in FIG. 1. As shown in FIG. 2, the cross-point device pair 203 includes an RRAM device 2031, and an access control device 2032 serially connected to the RRAM device 2031.

The cross-point device pair 203, in some implementations, has a 1T1R or a 1S1R structure. For example, the access control device 2032 may include a transistor or a selector.

Relaxation has been observed on several transition metal oxides used in an RRAM (e.g., TaOx, and HfOx), which have relatively high dielectric constant. These high dielectric constant oxides may have high polarization under an external electric field and high relaxation once the external electric field is removed, causing a relax in reset resistance or HRS or a decrease in its resistance, resulting in memory loss. It is the relax of the resistance from reset value or loss of resistance state after reset switching. The relax or loss of data (from the relax or change in resistance) can occur at the initial state (early loss of data, for example, within a fraction of a second) or long term. In the present disclosure, RRAM relaxation refers to the initial decrease of HRS resistance after a reset.

Programing and relaxation may be measured with Incremental Step Pulse Programming (ISPP) with a low voltage read (verify) pulse after each programming pulse. Once the target resistance is reached, the programming is stopped and a second (or multiple) read is applied to verify resistance after a specific period (relaxation time).

RRAM relaxation occurs in both low resistance states and high resistance states. RRAM relaxation in LRS is usually negligible; because LRS has less dielectric polarization and therefore less relaxation. RRAM relaxation in HRS, however, can be more severe, depending on the reset threshold resistance. The higher the resistance in FIRS, more dielectric polarization can occur under an electric field and more relaxation can occur when the electric field is removed. The relaxation in HRS may decrease the resistance from its reset value, or collapse the switch window to cause memory error or data loss.

RRAM relaxation in FIRS increases with increasing reset threshold resistance and with a short voltage pulse (for fast switch operation). Fast relaxation occurs initially (e.g., between initial to 1 ms or millisecond); slow relaxation occurs thereafter (e.g., after 1 ms). There are therefore several approaches to reduce RRAM FIRS relaxation; each has its own technical advantages.

One way to reduce relaxation is by reducing FIRS threshold resistance (which results in less reset). This way, the relaxation will be kept insignificant. To maintain the switch window, however, the LRS threshold resistance also needs to be reduced (which means more set). This, however, may increase LRS operation current and reset current.

Another way to reduce relaxation is by increasing the reset pulse width (which results in a longer reset voltage pulse). This approach, however, may reduce the reset speed and thus can limit its applications.

A third way to reduce relaxation is by increasing FIRS threshold resistance (which results in over reset) to offset relaxation. This approach increases the initial switching window and can maintain a switching window after HRS relaxation. Over reset, however, may increase device's stress and reduce device reliability.

A fourth way to reduce relaxation is by delaying verify read to used read after relaxation time instead of initial read right after programming. This approach may also reduce reset speed and also initially over reset the device.

The present disclosure also provides technologies for reducing HRS relaxation, taking advantage of materials' stability and dielectric properties. For instance, the thermodynamic phase stability, dielectric properties of oxides, and oxide/electrode interface stability.

FIGS. 3A-3C are dielectric constant tables as references in some implementations of the present disclosure.

FIG. 3A shows a dielectric constant table 300 including example oxides that have relatively high dielectric constant. The example RRAM oxides shown in FIG. 3A include: $Ta_2O_5$, $HfO_2$, $ZrO_2$, or $TiO_2$. These materials, $Ta_2O_5$ (Dk=22), $HfO_2$ (Dk=25), $ZrO_2$ (Dk=25) and $TiO_2$ (Dk=80), have relatively high dielectric constant. A switching layer of an RRAM device is, in some implementations, made of one of these materials or a combination thereof.

FIG. 3B shows a dielectric constant table 320 including example oxides that have relatively low dielectric constant. The example low dielectric constant oxides shown in FIG. 3B include: $SiO_2$ (Dk=3.9), and $Al_2O_3$ (Dk=9). These non-transition metal oxides are sometimes used to make inter-layer dielectrics.

FIG. 3C shows a dielectric constant table 340 including example oxides that have relatively low dielectric constant. The example low dielectric constant oxides shown in FIG. 3C include: $HfSiO_4$ (Dk=11) and $ZrSiO_4$ (Dk=9). These low dielectric constant oxides have excellent thermodynamic stability, which is often required to make switching layers.

Figure 4A:
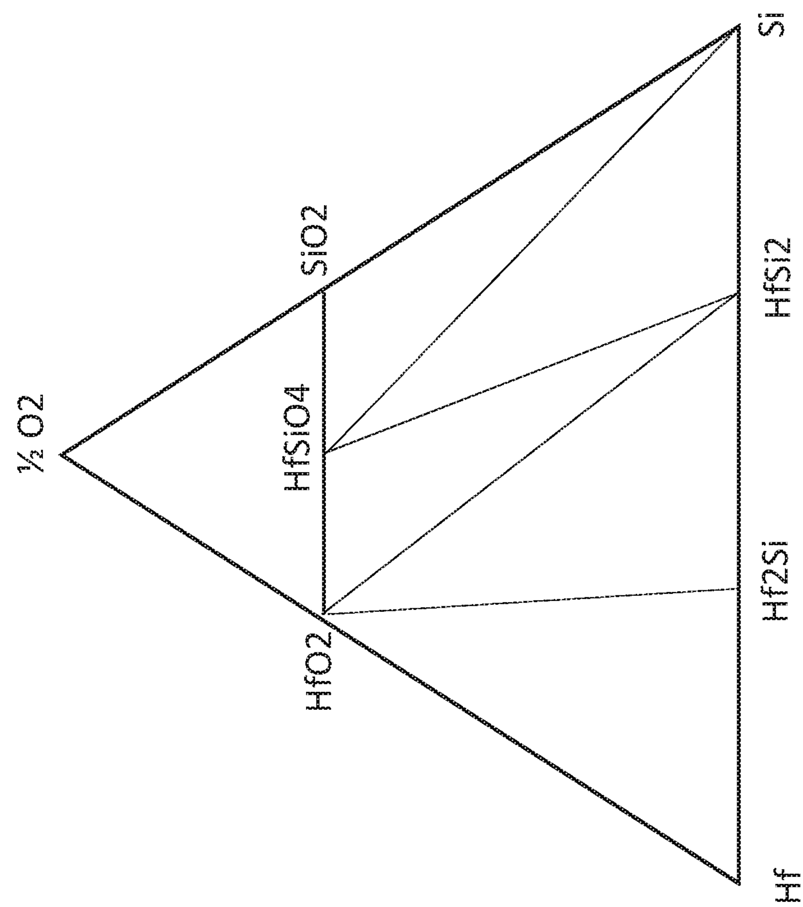
FIGS. 4A-4C are thermodynamic evaluation diagrams illustrating the phase stability for these materials' compositions.
Figure 4B:
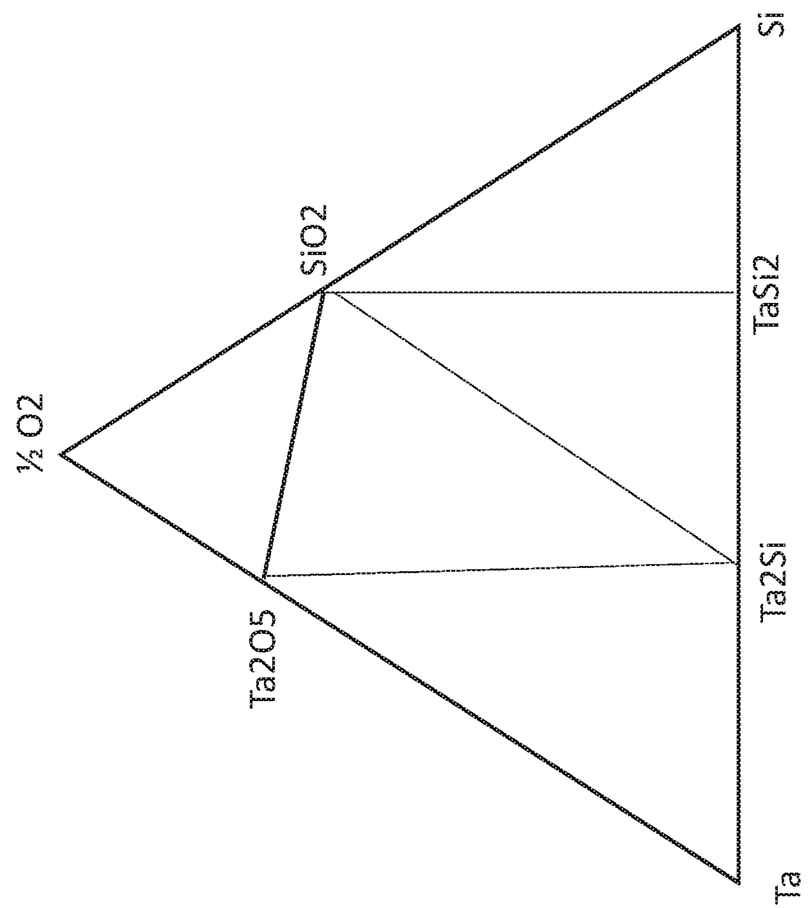
Figure 4C:
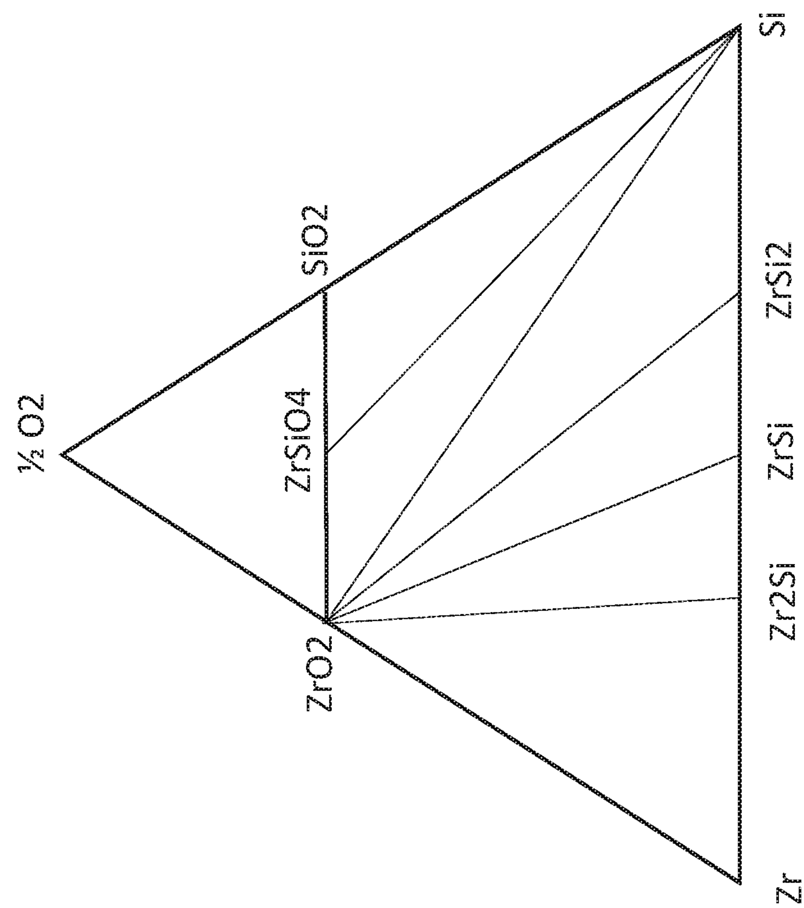

FIGS. 4A-4C are thermodynamic evaluation diagrams illustrating phase stabilities of several example compositions.

FIG. 4A shows a thermodynamic evaluation diagram 400 of Hf—O—Si ternary system and the corresponding phase stabilities. As shown in FIG. 4A, the isotherm of Hf—Si—O at 500 K shows the stability of ternary phase $HfSiO_4$ (on the Hf $O_2$—$SiO_2$ tie-line), which, in addition to $HfSiO_4$ having a low dielectric constant (Dk=11), makes $HfSiO_4$ a good candidate material for providing low dielectric relaxation. Mixing $SiO_2$ with $HfO_2$ or doping $SiO_2$ into $HfO_2$ may therefore produce a thin $HfSiO_4$ layer or a $HfO_2$ layer doped with $SiO_2$, respectively, both of which offer reduced relaxation.

FIG. 4B shows a thermodynamic evaluation diagram 420 of Ta—O—Si ternary system and the corresponding phase stabilities. As shown in FIG. 4B, the estimated isotherm of Ta—Si—O shows an equilibrium between $Ta_2O_5$ and $SiO_2$. Mixing $SiO_2$ with $TaO_x$ or doping $SiO_2$ into $TaO_x$ may therefore produce a thin $TaSiO_x$ layer or a $TaO_x$ layer doped with $SiO_2$, respectively, both of which offer reduced relaxation.

FIG. 4C shows a thermodynamic evaluation diagram 440 of Zr—O—Si ternary system and the corresponding phase stabilities. As shown in FIG. 4C, the estimated isotherm of Zr—Si—O shows the stability of ternary phase $ZrSiO_4$ (on the $ZrO_2$—$SiO_2$ tie-line), which, in addition to $ZrSiO_4$ having a low dielectric constant (Dk=9), makes $ZrSiO_4$ a good candidate material for providing low dielectric relaxation. Mixing $SiO_2$ with $ZrO_2$ or doping $SiO_2$ into $ZrO_2$ may therefore produce a thin $ZrSiO_4$ layer or a $ZrO_2$ layer doped with $SiO_2$, respectively, both of which offer reduced relaxation.

Figure 5A:
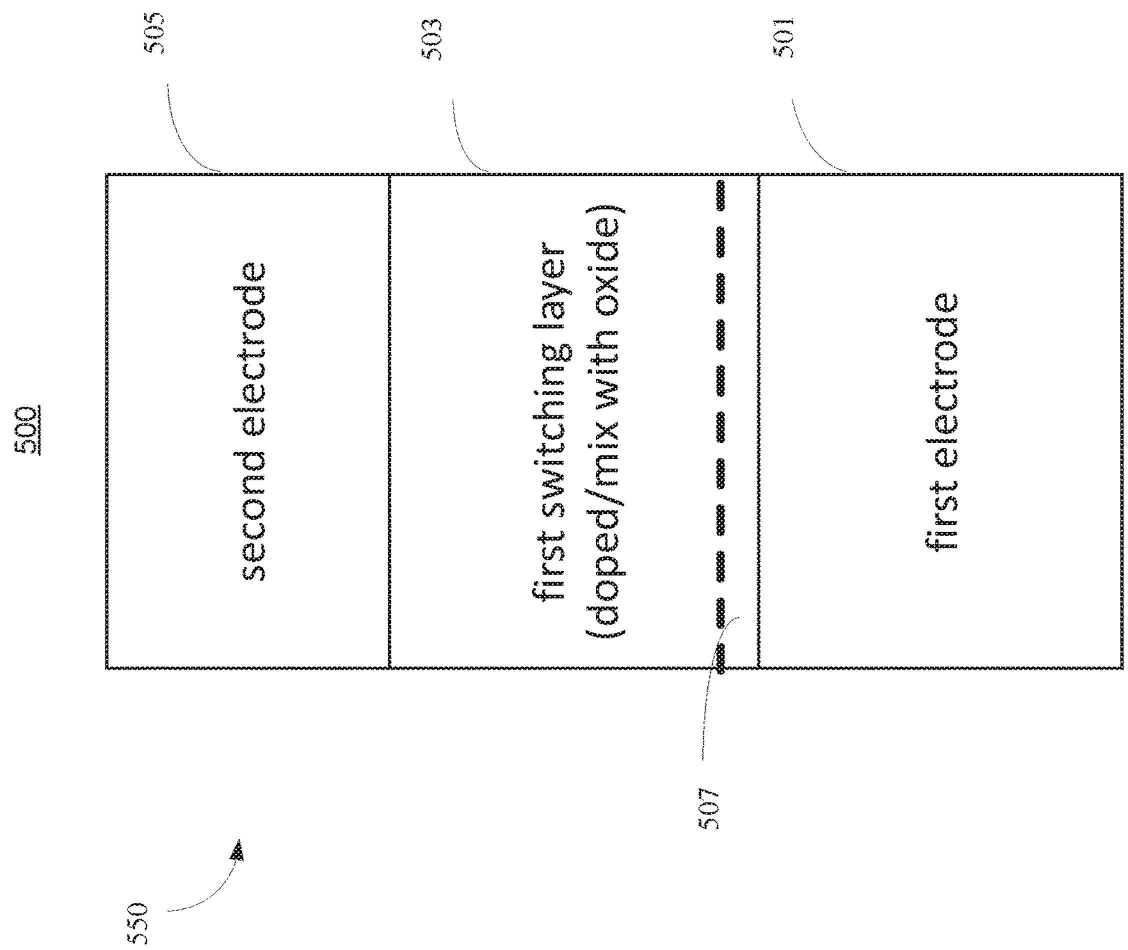
FIG. 5A is a cross-sectional view of an example RRAM device in accordance with some implementations of the present disclosure.

FIG. 5A is a cross-sectional view 500 of an example RRAM device 550 in accordance with some implementations of the present disclosure.

As shown in FIG. 5A, the RRAM device 550 includes a first electrode 501, a first switching layer 503 formed on the first electrode 501, and a second electrode 505 formed on the first switching layer 503.

The first switching layer 503 is, in some implementations, made of one of the following materials: $ZrO_x$ (e.g., $ZrO_2$), $HfO_x$ (e.g., $HfO_2$), $TiO_x$ (e.g., $TiO_2$), or $TaO_x$ (e.g., $TaO_2$, $Ta_2O_5$). The first switching layer 503 is, in some implementations, doped with a first low-dielectric oxide material, for example, $SiO_2$ or $Al_2O_3$. The first switching layer 503 is, in some implementations, doped with a dielectric material, the dielectric constant of which is no more than 10.

In some implementations, a thin layer 507 may be formed (1) within the first switching layer 503, (2) between the first switching layer 503 and the first electrode 501, or (3) between the first switching layer 503 and the second electrode 505. The thin layer 507 is, in some implementations, made of one of the following materials: $ZrSiO_x$ (e.g., $ZrSiO_4$), $TaSiO_x$ (e.g., $TaSiO_4$), $HfSiO_x$ (e.g., $HfSiO_4$), and $TiSiO_x$ (e.g., $TiSiO_4$).

Moreover, forming the thin layer 507 between the first switching layer 503 and the first electrode 501 or between the first switching layer 503 and the second electrode 505 may enhance the oxide/electrode interface stability and reduce leakage current.

The first electrode 501 is, in some implementations, made of one of the following materials: Pt, Pd, W, Ti, TiN and TaN. The second electrode 505 is, in some implementations, also made of one of the following materials: Pt, Pd, Ta, Ti, Hf, W, TiN, and TaN.

Figure 5B:
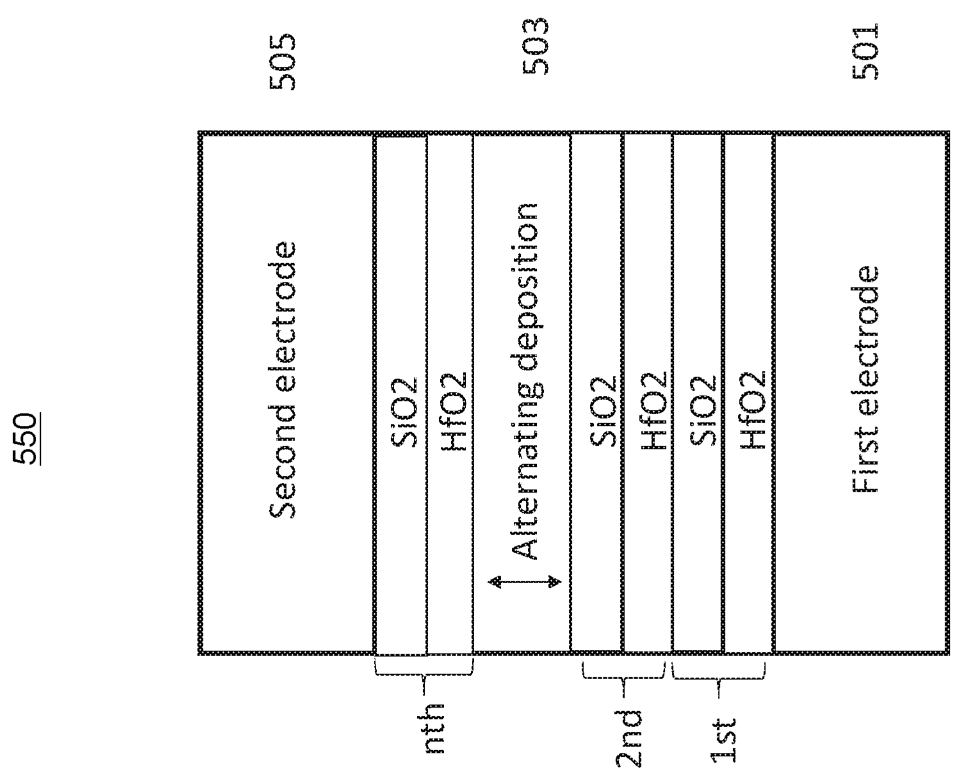
FIG. 5B is a cross-sectional view of an example RRAM device in accordance with some implementations of the present disclosure.

FIG. 5B is a cross-sectional view 550 of an example RRAM device in accordance with some implementations of the present disclosure.

A shown in FIG. 5B, the first switch layer 503 is, in some implementations, made by co-depositing one of the oxides selected from ZrOx (e.g., ZrO2), HfOx (e.g., HfO2), TiOx (e.g., TiO2), and TaOx (e.g., $TaO_2$, $Ta_2O_5$) with one of the oxides selected from $SiO_2$ and $Al_2O_3$, or alternatively by alternatingly depositing thin layers of one of the oxides selected from ZrOx (e.g., $ZrO_2$), HfOx (e.g., $HfO_2$), $TiO_x$ (e.g., $TiO_2$), and $TaO_x$ (e.g., $TaO_2$, $Ta_2O_5$), on top of thin layers of one of the oxides selected from $SiO_2$ and $Al_2O_3$, For instance, a low dielectric constant first switching oxide may be made by sputter $HfSiO_4$, or co-sputter HfO2, and $SiO_2$ to form $HfSiO_4$ on a substrate, or alternatingly depositing layers of $HfO_2$ and layers of $SiO_2$ in atomic thickness with Atomic Layer Deposition (ALD).

Figure 6:
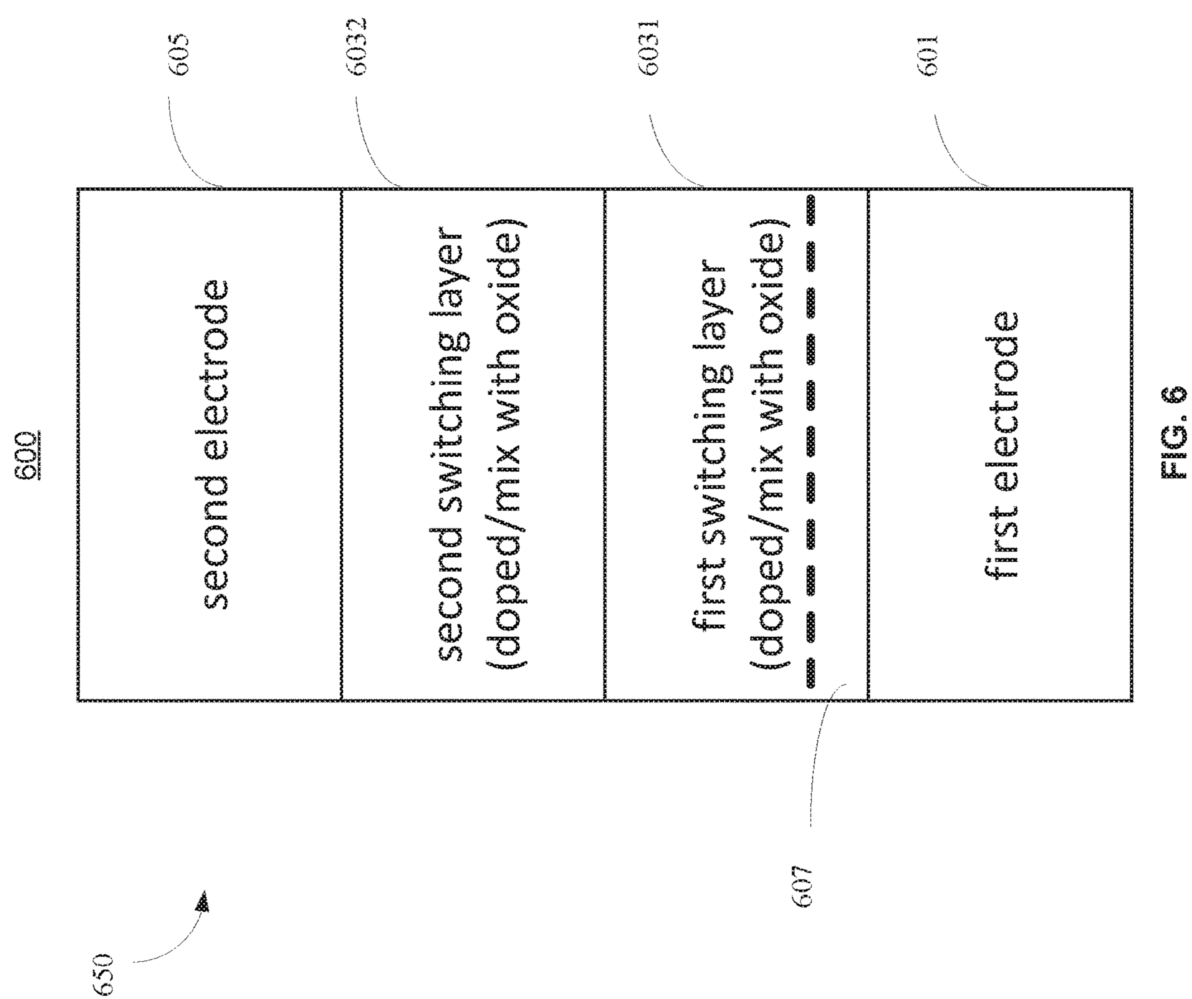
FIG. 6 is a second cross-sectional view of an example RRAM device in accordance with some implementations of the present disclosure.

FIG. 6 is a second cross-sectional view 600 of an example RRAM device 650 in accordance with some implementations of the present disclosure.

In FIG. 6, the RRAM device 650 includes a first electrode 601, a first switching layer 6031 formed on the first electrode 601, a second switching layer 6032 formed on the first switching layer 6031, and a second electrode 605 formed on the second switching layer 6032.

The first switching layer 6031 is, in some implementations, made of one of the following materials: $ZrO_x$ (e.g., $ZrO_2$), $HfO_x$ (e.g., $HfO_2$), $TiO_x$ (e.g., $TiO_2$), and $TaO_x$ (e.g., $TaO_2$, $Ta_2O_5$). In some implementations, the first switching layer 6031 is doped with a first low-dielectric oxide material, for example, $SiO_2$, or $Al_2O_3$. In some implementations, the first switching layer 6031 is doped with a dielectric material, the dielectric constant of which is no more than 10.

The second switching layer 6032 is, in some implementations, made of one of the following materials: $HfO_x$, $TaO_x$, and $TiO_x$. In some implementations, the second switching layer 6032 is doped with a second low-dielectric oxide material, for example, $SiO_2$, or $Al_2O_3$. In some implementations, the second switching layer 6032 is doped with a dielectric material, the dielectric constant of which is no more than 10.

In some implementations, a thin layer 607 may be formed (1) within the first switching layer 6031, (2) within the second switching layer 6032, (3) between the first switching layer 6031 and the first electrode 601, (4) between the first switching layer 6031 and the second switching layer 6032, or (5) between the second switching layer 6032 and the second electrode 605.

The thin layer 607 is, in some implementations, made of one of the following materials: $ZrSiO_x$ (e.g., $ZrSiO_4$), $TaSiO_x$ (e.g., $TiSiO_4$), $HfSiO_x$ (e.g., $HfSiO_4$), or $TiSiO_x$ (e.g., $TiSiO_4$). As explained above, forming the thin layer 607 between the first switching layer 6031 and the first electrode 601 may enhance the thermodynamic stability of the oxide/electrode interface and reduce leakage current. Moreover, forming the thin layer 607 is formed between the first switching layer 6031 and the second switching layer 6032 may enhance the interface stability of the two switching layers.

The first electrode 601 is, in some implementations, made of one of the following materials: Pt, Pd, W, Ti, TiN and TaN. The second electrode 605 is, in some implementations, also made of one of the following materials: Pt, Pd, Ta, Ti, Hf, W, TiN, and TaN.

Figure 7:
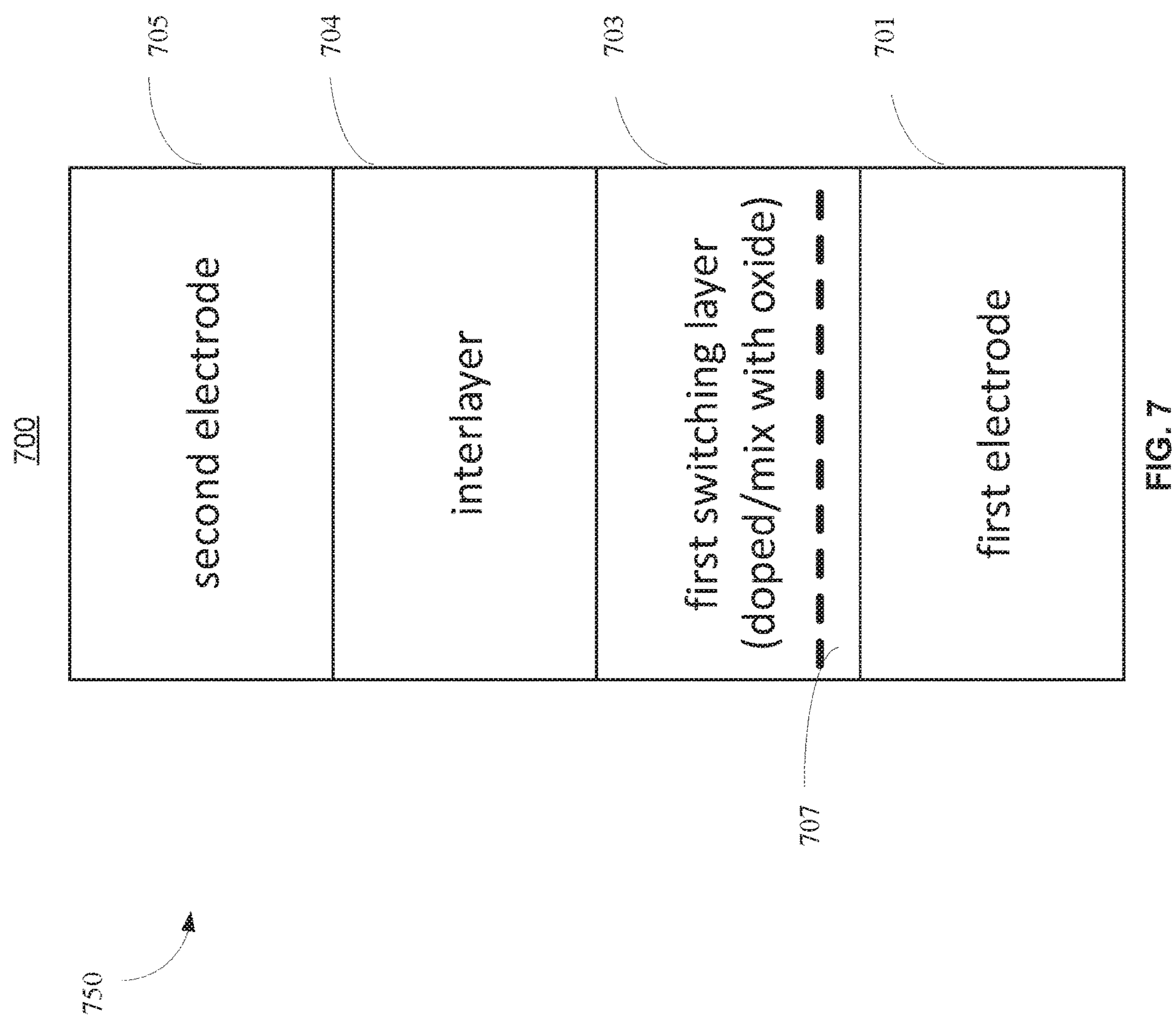
FIG. 7 is a third cross-sectional view of an example RRAM device in accordance with some implementations of the present disclosure.

FIG. 7 is a third cross-sectional view 700 of an example RRAM device 750 in accordance with some implementations of the present disclosure. As shown in FIG. 7, the RRAM device 750 includes a first electrode 701, a first switching layer 703 formed on the first electrode 701, an interlayer 704 formed on the first switching layer 703, and a second electrode 705 formed on the interlayer 704.

The first switching layer 703 is, in some implementations, made of one of the following materials: $ZrO_x$ (e.g., $ZrO_2$), $HfO_x$ (e.g., $HfO_2$), $TiO_x$ (e.g., $TiO_2$), and $TaO_x$ (e.g., $TaO_2$ and $Ta_2O_5$). In some implementations, the first switching layer 703 is doped with a first low-dielectric oxide material including $SiO_2$, or $Al_2O_3$. In some implementations, the first switching layer 703 is doped with a dielectric material whose dielectric constant is no more than 10.

The interlayer 704 is, in some implementations, made of one of the following materials: $SiO_2$, $Al_2O_3$, and Si.

Because, in the present disclosure, a switching event occurs when defined as a resistance changes from HRS to LRS or from LRS to HRS. In accordance with this definition, therefore, an interlayer (e.g., $SiO_2$ or $Al_2O_3$) formed between the switching layer and the electrode that does not change its resistance is not deemed as a switching layer.

The thin layer 707 is, in some implementations, formed (1) within the first switching layer 703, (2) between the first switching layer 703 and the first electrode 701, or (3) between the first switching layer 703 and the interlayer 704.

The thin layer 707 is, in some implementations, made of one of the following materials: $ZrSiO_x$ (e.g., $ZrSiO_4$), $TaSiO_x$ (e.g., $TaSiO_4$), $HfSiO_x$ (e.g., $HfSiO_4$), or $TiSiO_x$ (e.g., $TiSiO_4$). As explained above, forming the thin layer 707 between the first switching layer 703 and the first electrode 701 may enhance the oxide/electrode interface stability and reduce leakage current.

The first electrode 701 is, in some implementations, made of one of the following materials: Pt, Pd, W, Ti, TiN and TaN. The second electrode 705 is, in some implementations, also made of one of the following materials: Pt, Pd, Ta, Ti, Hf, W, TiN and TaN.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:

a first row wire;

a first column wire;

an RRAM device;

an access control device, wherein the RRAM device and the access control device serially connected and connecting between the first row wire and the first column wire, and wherein the RRAM device comprises:

a first electrode;

a first switching layer formed on the first electrode, wherein a material of the first switching layer comprises $ZrO_2$, $HfO_2$, $TiO_2$, or $Ta_2O_5$;

a second electrode formed on the first switching layer, wherein the first switching layer is doped with a first oxide material comprising $SiO_2$, or $Al_2O_3$; and a first thin layer formed between the first electrode and the first switching layer, and the first thin layer is made of one of the following materials: $ZrSi_xO_y$, $HfSi_xO_y$, $TaSi_xO_y$, and $TiSi_xO_y$, wherein the material of the first thin layer has thermodynamically stable ternary phase and the first thin layer has a lower dielectric constant than that of the first switching laver.

2. The apparatus as claimed in claim 1, further comprising:

a second switching layer formed between the first switching layer and the second electrode, wherein the second switching layer is made of one of the following materials: $CeO_x$, $HfO_x$, $TaO_x$, and $TiO_x$.

3. The apparatus as claimed in claim 2, wherein the second switching layer is doped with a second oxide material comprising $SiO_2$, or $Al_2O_3$.

4. The apparatus as claimed in claim 3, wherein the RRAM device further comprises:

a second thin layer formed between the second electrode and the second switching layer, and the second thin layer is made of one of the following materials: $ZrSi_xO_y$, $HfSi_xO_y$, $TaSi_xO_y$, and $TiSi_xO_y$, wherein the material of the second thin layer has thermodynamically stable ternary phase and the second thin layer has a lower dielectric constant than that of the second switching layer.

5. The apparatus as claimed in claim 3, wherein the RRAM device further comprises:

a third thin layer formed between the first switching layer and the second switching layer, and the third thin layer is made of one of the following materials: $ZrSi_xO_y$, $HfSi_xO_y$, $TaSi_xO_y$, and $TiSi_xO_y$, wherein the material of the third thin layer has thermodynamically stable ternary phase and the third thin layer has a lower dielectric constant than that of the first switching layer and the second switching layer.

6. The apparatus as claimed in claim 1, further comprising:

an interlayer formed between the first switching layer and the second electrode; wherein a material of the interlayer comprises $SiO_2$, $Al_2O_3$ or Si.

7. The apparatus as claimed in claim 6, wherein the RRAM device further comprises:

a fourth thin layer formed between the first switching layer and the interlayer, and the fourth thin layer is made of one of the following materials: $ZrSi_xO_y$, $HfSi_xO_y$, $TaSi_xO_y$, and $TiSi_xO_y$, wherein the material of the fourth thin layer has thermodynamically stable ternary phase and the fourth thin layer has a lower dielectric constant than that of the first switching layer.

8. The apparatus as claimed in claim 1, wherein the access control device comprises a transistor or a selector.

9. The apparatus as claimed in claim 1, wherein the first electrode is made of one of the following materials: Pt, Pd, Ta, Ti, Hf, W, TiN, and TaN.

10. The apparatus as claimed in claim 1, wherein the second electrode is made of one of the following materials: Pt, Pd, Ta, Ti, Hf, W, TiN, and TaN.

11. The apparatus as claimed in claim 1, wherein the first thin layer is made of one of the following materials: $ZrSiO_4$, $HfSiO_4$, $TaSiO_4$, and $TiSiO_4$.

12. An apparatus comprising:

a first row wire; a first column wire; an RRAM device;

an access control device, wherein the RRAM device and the access control device serially connected and connecting between the first row wire and the first column wire, and wherein the RRAM device comprises:

a first electrode;

a first switching layer formed on the first electrode;

a second electrode formed on the first switching layer; and a thin layer formed between the first electrode and the first switching layer, wherein the first switching layer is made of one of the following materials: $ZrO_2$ and $Ta_2O_5$; and the thin layer is made of one of the following materials: $ZrSiO_4$ and $TaSiO_4$.

13. An apparatus comprising:

a first row wire;

a first column wire;

an RRAM device;

an access control device, wherein the RRAM device and the access control device serially connected and connecting between the first row wire and the first column wire, and wherein the RRAM device comprises:

a first electrode;

a first switching layer formed on the first electrode;

a second switching layer formed on the first switching layer;

a second electrode formed on the second switching layer; and a thin layer formed between the first switching layer and the second switching layer, wherein the first switching layer is made of one of the following materials: $ZrO_2$, and $Ta_2O_5$;

the second switching layer is made of one of the following materials: $CeO_x$, $HfO_x$, $TaO_x$, and $TiO_x$; and the thin layer is made of one of the following materials: $ZrSiO_4$ and $TaSiO_4$.

* * * * *